United States Patent
Saito (10) Patent No.: US 8,344,557 B2
(45) Date of Patent: Jan. 1, 2013

(54) MAGNETIC FLUX MEASURING DEVICE AND MAGNETIC FLUX MEASURING METHOD FOR STATIONARY INDUCTION ELECTRICAL APPARATUS, AND SYNCHRONOUS SWITCHING CONTROL GEAR FOR CIRCUIT BREAKER

(75) Inventor: Minoru Saito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 501 days.

(21) Appl. No.: 12/445,640

(22) PCT Filed: Oct. 12, 2007

(86) PCT No.: PCT/JP2007/001111
§ 371 (c)(1),
(2), (4) Date: Mar. 15, 2010

(87) PCT Pub. No.: WO2008/047469
PCT Pub. Date: Apr. 24, 2008

(65) Prior Publication Data
US 2010/0187916 A1    Jul. 29, 2010

(30) Foreign Application Priority Data

Oct. 16, 2006    (JP) .................................. 2006-281493

(51) Int. Cl.
*H01H 9/54* (2006.01)
*H01H 33/59* (2006.01)
*H01H 47/00* (2006.01)
*H01H 85/46* (2006.01)
*H01H 3/26* (2006.01)
*H01H 3/28* (2006.01)

(52) U.S. Cl. .......................................... 307/140; 361/35
(58) Field of Classification Search .................. 307/101, 307/125, 140; 361/35, 111
See application file for complete search history.

(56) References Cited

U.S. PATENT DOCUMENTS 5,560,115 A   10/1996 Fowler
(Continued)

FOREIGN PATENT DOCUMENTS

JP    2000 275311    10/2000
(Continued)

OTHER PUBLICATIONS

Portales, E. et al., "Controlled Switching Of Unloaded Power Transformers", ELECTRA, No. 212, p. 38-47 (2004).
Supplementary Search Report issued Mar. 9, 2012 in European Patent Application No. 07827890.0-2216.

*Primary Examiner* — Carlos Amaya
(74) *Attorney, Agent, or Firm* — Oblon, Spivak, McClelland, Maier & Neustadt, L.L.P.

(57) ABSTRACT

The present invention provides a magnetic flux measuring device and magnetic flux measuring method for stationary induction electrical apparatus which can accurately measure the magnetic flux without being influenced by the DC offset component which superimposes on the measurement system, and can constantly and continuously measure the magnetic flux without setting a limit in the magnetic flux measurement period. The magnetic flux measuring method which measures a magnetic flux of a stationary induction electrical apparatus 2 using a voltage waveform of the stationary induction electrical apparatus 2, wherein the magnetic flux 151 of the stationary induction electrical apparatus 2 is determined by the steps of: inputting a voltage waveform 121 of the stationary induction electrical apparatus 2 into a negative-feedback amplification means 14 of which feedback circuit is constructed by a low pass filter; and integrating output of the negative-feedback amplification means 14 by integration means 15.

8 Claims, 8 Drawing Sheets

U.S. PATENT DOCUMENTS

| | | |
|---|---|---|
| 6,043,647 A | 3/2000 | Shih |
| 6,124,713 A | 9/2000 | Bornhofft et al. |
| 2010/0013470 A1* | 1/2010 | Tsutada et al. ............... 324/244 |
| 2010/0194373 A1* | 8/2010 | Hamberger et al. .......... 323/356 |

FOREIGN PATENT DOCUMENTS

| | | |
|---|---|---|
| JP | 2003 232840 | 8/2003 |
| JP | 2003 289671 | 10/2003 |
| JP | 2005 204368 | 7/2005 |

* cited by examiner

MAGNETIC FLUX MEASURING DEVICE AND MAGNETIC FLUX MEASURING METHOD FOR STATIONARY INDUCTION ELECTRICAL APPARATUS, AND SYNCHRONOUS SWITCHING CONTROL GEAR FOR CIRCUIT BREAKER

TECHNICAL FIELD

The present invention relates to a magnetic flux measuring device and magnetic flux measuring method for measuring magnetic flux of a stationary induction electrical apparatus, such as a transformer and reactor, and to a synchronous switching controlgear for circuit breaker.

BACKGROUND ART

When a stationary induction electrical apparatus, such as a transformer and reactor, is electrically connected to an electric power system, a big transient magnetizing inrush current may flow. After a stationary induction electrical apparatus has been electrically connected to the system, alternating magnetic flux, of which initial value is a residual magnetic flux when the circuit breaker is opened, flows into the iron core, and the transient magnetizing inrush current flows when the magnetic flux exceeds the magnetic saturation point of the iron core, and as the residual magnetic flux becomes higher, the saturation degree of the iron core increases, and transient magnetizing inrush current increases.

In the case of a transformer, the transient magnetizing inrush current (multiplying factor with respect to the rated current of the first wave peak value) reaches several magnitudes, so it is necessary to take measures to prevent the malfunction of a ratio differential relay for transformer protection or an overcurrent relay for power receiving, which is installed to activate when a short circuit accident occurs at the secondary side of the transformer, or to take measures considering the design of the transfer so as to withstand the electromagnetic force generated by the transient magnetizing inrush current. The transient magnetizing inrush current has a waveform protruding in one direction (like a half-wave rectification), and therefore contains many higher harmonics, such as a second harmonic and fourth harmonic.

Hence [the transient magnetizing inrush current] temporarily becomes a higher harmonic current source, and it is necessary to take measures so that this [higher harmonic current source] does not affect a static capacitor and various AC filter equipment installed in the system. If the transient magnetizing inrush current is extremely high, the electric power system may be affected, such as an instantaneous drop in power system voltage.

In order to decrease the transient magnetizing inrush current, it is suggested to calculate the residual magnetic flux based on the voltage of each phase of the transformer, and consider the feed timing of the circuit breaker (phase) so as to cancel the residual magnetic flux of each phase, as shown in Patent Document 1 and Non-patent Document 1, for example.

An example of a conventional method for determining the residual magnetic flux of a stationary induction electrical apparatus is measuring the change of the induced voltage generated in the stationary induction electrical apparatus when power supply is interrupted, loading this voltage waveform into a computer, performing an integration operation to determine the magnetic flux waveform, and determining the residual magnetic flux from the difference between the final value of this magnetic flux waveform and the center value of the sinusoidal vibration of the magnetic flux waveform before opening (see Patent Document 2).

Another example of a method for determining the residual magnetic flux is a magnetic flux measuring method for a stationary induction electric equipment, comprising: opening detection means for detecting an opening time of a circuit breaker connected to a power supply circuit of a stationary induction electrical apparatus; voltage signal measurement means for storing voltage signals of the power supply circuit for a predetermined time, and measuring the voltage signals of the power supply circuit before and after opening of the circuit breaker; voltage signal offset removal means for calculating the offset of the voltage signal before opening of the circuit breaker and removing the offset from the voltage signal; voltage signal integration block detection means for deciding the end of integration based on the voltage signal after opening of the circuit breaker; voltage signal integration means for integrating voltage signals; magnetic flux signal calculation means for acquiring a magnetic flux signal by removing the offset of the voltage integration signal; and residual magnetic flux calculation means for calculating the residual magnetic flux value from the magnetic flux signal (see Patent Document 3).

Patent Document 1: Japanese Patent Application Laid-Open No. 2005-204368
Patent Document 2: Japanese Patent Application Laid-Open No. 2000-275311
Patent Document 3: Japanese Patent Application Laid-Open No. 2003-232840
Non-Patent Document 1: "Controlled Switching of Unloaded Power Transformers", Electra No. 212, p. 38 (2004)

In the case of the method for measuring the magnetic flux proposed in Patent Document 2, the final value of the magnetic flux waveform acquired by integrating the voltage is not constant, but increases or decreases monotonously because of the influence of the DC offset component superimposed on the measurement system. In the case of the magnetic flux waveform shown in FIG. 2 of Patent Document 2, for example, the final value $\phi 1$ is increasing monotonously. If the DC offset component is high, the integration result may diverge in a short time. Hence in the case of the invention according to Patent Document 2, the magnetic flux is different depending on the timing of reading, and an accurate residual magnetic flux cannot be calculated.

It is the magnetic flux measuring method according to Patent Document 3 that proposes one solution to the problem of Patent Document 2. The magnetic flux measuring method according to Patent Document 3 proposes a method of eliminating the influence of the DC offset component superimposed on the measurement system by calculating the DC offset from the sinusoidal voltage waveform before the circuit breaker performs opening operation, and integrating the resulting waveform after subtracting this DC offset from the voltage waveform as shown in FIG. 2 in Patent Document 3. This offset of the magnetic flux waveform as a result of the integration is also removed in the same way to calculate the residual magnetic flux.

However a problem of the method of Patent Document 3 is that the period of integrating a voltage waveform, which is executed to calculate the magnetic flux waveform, is extremely limited. In other words, the integration operation is performed for a voltage waveform in 200 ms and 100 ms periods before and after opening of the circuit breaker respectively. The reason why the integration operation period is limited is because the voltage waveform to be the integration target for removing offset must be stored once in the storage media, such as a memory.

For example, a 9.6 kB/phase memory capacity is required to store digital data having a voltage waveform which was analog-digital converted at 16-bit 4800 Hz for one second, and a memory capacity several times this capacity is required to execute the residual magnetic flux calculation proposed by Patent Document 3. Considering the cost-to-performance of the device in terms of economy and practicality, the calculation period of the magnetic flux waveform, that can be calculated by the magnetic flux measuring method proposed by Patent Document 3, is at most several seconds.

If the magnetic flux waveform measurement period is limited like this, the magnetic flux measuring device may experience a practical problem. In the case of the synchronous switching controlgear for circuit breaker considering residual magnetic flux, as shown in Patent Document 1 and Non-patent Document 1, it is critical to accurately measure the residual magnetic flux at all times, and having a limitation in the magnetic flux waveform measurement period may cause a practical problem.

For example, when a circuit breaker having an inter-pole capacitor switches a stationary induction electrical apparatus without load, voltage appears in the stationary induction electrical apparatus terminal via the inter-pole capacitor even after the circuit breaker is opened. Therefore, as FIG. 11 of Non-patent Document 1 shows, a large voltage may be generated in the stationary induction electrical apparatus terminal by the transient voltage which is generated after opening when an accident occurs of an external circuit of the stationary induction electrical apparatus, such as an electric station bus, and the residual magnetic flux may change. Since it is impossible to predict when this change of residual magnetic flux will occur, the magnetic flux waveform must be measured at all times.

Even in the normal power supply interruption operation of the stationary induction electrical apparatus, including opening when an accident occurs, the transient phenomena of the voltage waveform after power supply is interrupted may continue for several tens of seconds, depending on the impedance of the stationary induction electrical apparatus and the impedance conditions of the peripheral circuits thereof, and in order to accurately measure the residual magnetic flux in such a case, it is necessary to measure the magnetic flux waveform for several tens of seconds.

In this way, limiting the magnetic flux waveform measurement period is a problem that must be solved when the magnetic flux measuring method for the stationary induction electrical apparatus is applied to the synchronous switching controlgear of a circuit breaker, considering the residual magnetic flux.

DISCLOSURE OF THE INVENTION

With the foregoing in view, it is an object of the present invention to provide a magnetic flux measuring device and magnetic flux measuring method for stationary induction electrical apparatus, which can accurately measure the magnetic flux without being influenced by the DC offset component which superimposes on the measurement system, and can constantly and continuously measure the magnetic flux without setting a limit in the magnetic flux measurement period.

It is another object of the present invention to provide a synchronous switching controlgear for circuit breaker which performs synchronous switching control for circuit breaker considering the residual magnetic flux determined by the above magnetic flux measuring device and magnetic flux measuring method.

To achieve the above objects, an aspect of the invention provides a magnetic flux measuring method for stationary induction electrical apparatus, which measures a magnetic flux of a stationary induction electrical apparatus using a voltage waveform of the stationary induction electrical apparatus, characterized in that the magnetic flux of the stationary induction electrical apparatus is determined by the steps of: inputting a voltage waveform of the stationary induction electrical apparatus into a negative-feedback amplification means of which feedback circuit is constructed by a low pass filter; and integrating output of the negative-feedback amplification means by integration means.

Another aspect of the invention provides a magnetic flux measuring device for stationary induction electrical apparatus, which measures a magnetic flux of a stationary induction electrical apparatus using a voltage waveform of the stationary induction electrical apparatus, comprising: input means for inputting a voltage waveform of the stationary induction electrical apparatus; negative-feedback amplification means for inputting a voltage signal which is output from the input means, and of which feedback circuit is constructed by a low pass filter; and integration feedback amplification means to determine a magnetic flux by integrating the output of the negative-feedback amplification means.

Another aspect of the invention provides a synchronous switching controlgear for circuit breaker which performs synchronous switching control for circuit breaker connected to an electric power system circuit, along with a stationary induction electrical apparatus, comprising: closing phase decision means for deciding a target feed phase according to the residual magnetic flux determined by the magnetic flux measuring device according to the present invention using a voltage waveform of the stationary induction electrical apparatus; reference point detection means for detecting a reference point for synchronous switching control based on the voltage waveform of the power supply of the electric power system circuit; and a closing command output delaying means for calculating delay time for a closing command and performing delay control of the closing command based on the target feed phase decided by the closing phase decision means and the reference point detected by the reference point detection means.

According to the present invention, a magnetic flux measuring device, magnetic flux measuring method for stationary induction electrical apparatus, and a synchronous switching controlgear for circuit breaker which can accurately measure the magnetic flux without being influenced by the DC offset component which superimposes on the measurement system, and can constantly and continuously measure the magnetic flux without setting a limit in the magnetic flux measurement period, can be provided.

EXPLANATION OF REFERENCE NUMERALS

2: transformer
3: circuit breaker
4, 4T, 4B: voltage transformer
10: magnetic flux measuring device
14: negative-feedback amplification means
15: integration means
151: magnetic flux signal
16: digital data of transformer voltage signal
17: residual magnetic flux calculation means
171: residual magnetic flux
172: magnetic flux convergence detection means
173: magnetic flux average calculation means
174: residual magnetic flux calculation means
20: synchronous switching controlgear
21: reference point detection means
22: closing phase decision means
23: closing command output delaying means
24: closing command output control unit
$T_w$: zero cross point wait time
$T_{delay}$: synchronous closing delay time
$T_{target}$: time from zero cross point to target closing phase ($T_{target} < T_{freq}$)
$T_{closing}$: closing operation time
$T_{freq}$: system cycle
$T_{pre\text{-}arcing}$: pre-arcing time
$T_{total}$: total wait time from input to output of closing command signal
$t_{command}$: input timing of closing command signal
$t_{zero}$: timing of next zero cross point after closing command signal is input
$t_{control}$: output timing of closing command signal
$t_{close}$: mechanical closing timing of contacts
$t_{make}$: electrical closing (making) timing

BEST MODE FOR CARRYING OUT THE INVENTION

Embodiments of the magnetic flux measuring device according to the present invention will now be described with reference to the drawings.

A common composing element in each drawing is denoted with a same reference symbol or related symbol, thereby redundant description is omitted unless necessary.

Embodiment 1

Figure 1:
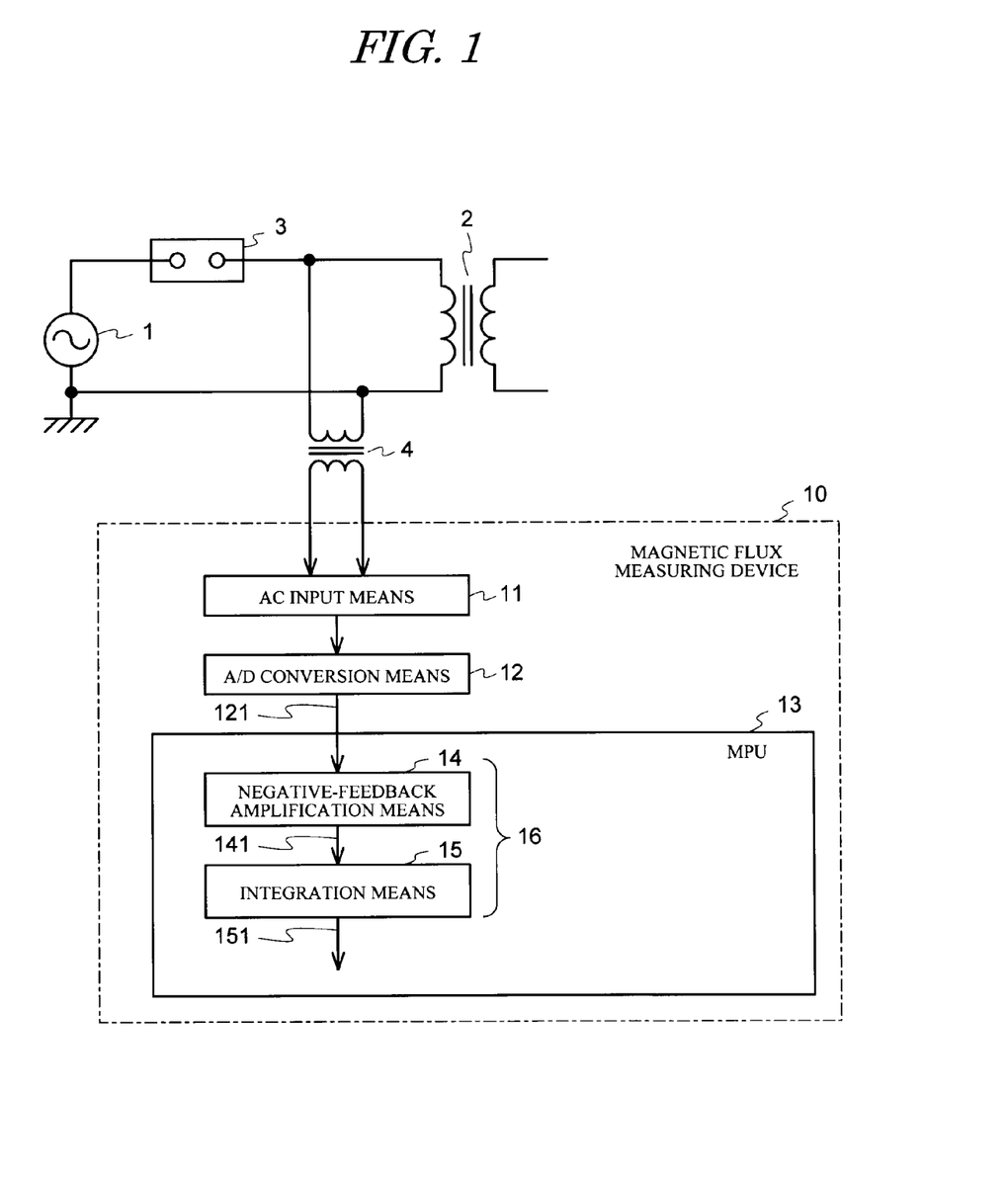
FIG. 1 is a diagram depicting a system configuration of a magnetic flux measuring device according to Embodiment 1 of the present invention.
Figure 2:
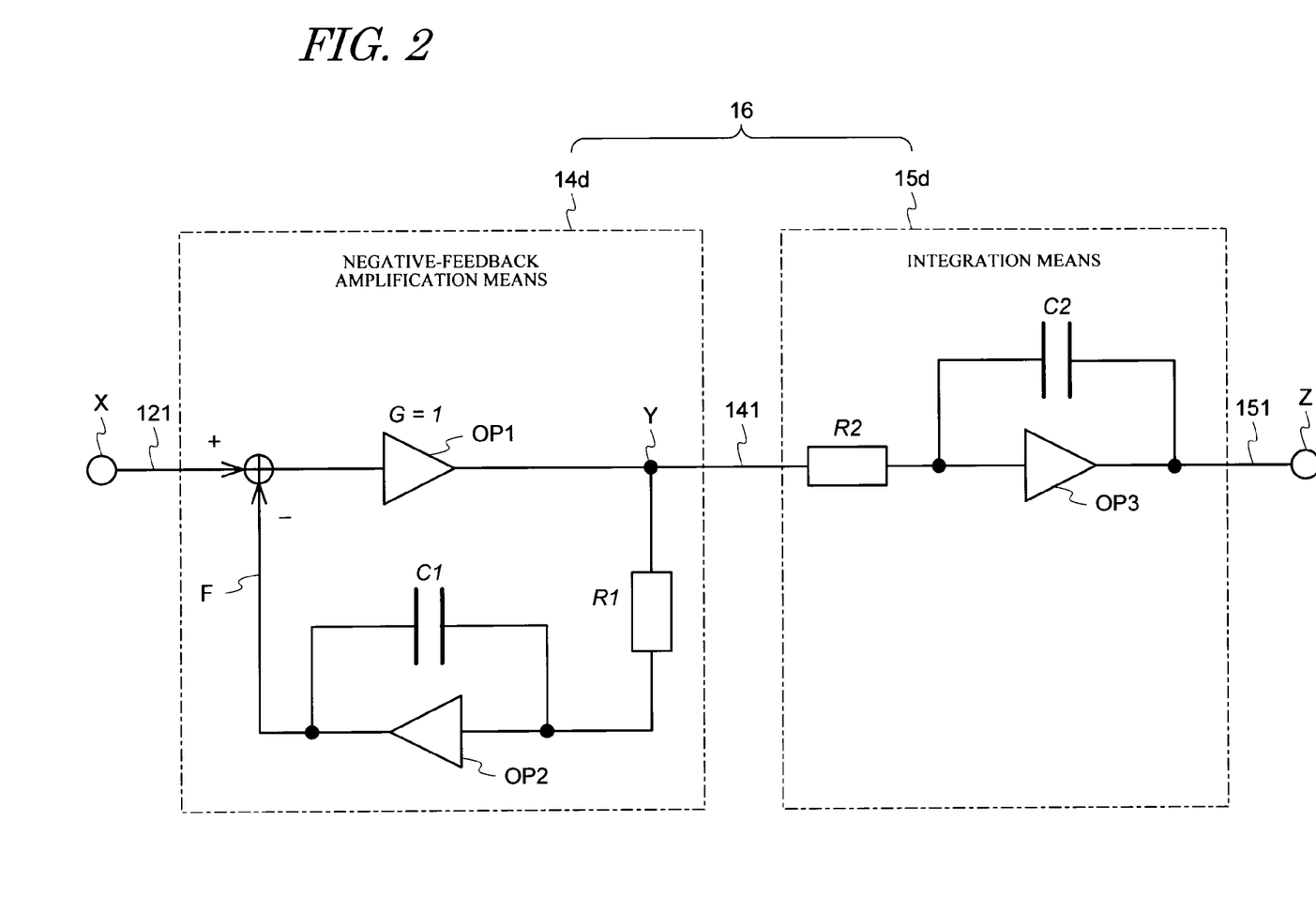
FIG. 2 is a diagram depicting equivalent circuits of the negative-feedback amplification means and integration means of the magnetic flux measuring device according to Embodiment 1 of the present invention.

FIG. 1 is a diagram depicting a system configuration of a magnetic flux measuring device of a stationary induction electrical apparatus according to Embodiment 1 of the present invention, and FIG. 2 shows equivalent circuits of negative-feedback amplification means and integration means of the magnetic flux measuring device.

(Configuration)

The configuration of Embodiment 1 will be described first with reference to FIG. 1.

1 is a power supply, 2 is a transformer as the stationary induction electrical apparatus connected to the power supply 1, 3 is a circuit breaker which is connected to an electric power system circuit between the power supply 1 and the transformer 2, which performs power supply or power supply interruption to the transformer 2 by switching the electric power system circuit, and 4 is a voltage transformer, which is connected to a primary side terminal of the transformer 2, and extracts and outputs voltage to be applied to the transformer 2 as the transformer voltage signal.

FIG. 1 shows an example of connecting the voltage transformer 4 to the primary side of the transformer 2 to acquire the transformer voltage signal, but may be connected to the secondary side so that the transformer voltage signal is acquired from the output voltage thereof.

The portion which is connected to the secondary side of the voltage transformer 4 so as to acquire the transformer voltage signal, that is, the portion enclosed by the dash and dotted line, is the magnetic flux measuring device 10.

Hardware of the magnetic flux measuring device 10 is comprised of AC input means 11, analog-digital conversion means (A/D conversion means in FIG. 1) 12, and MPU (MicroProcessor Unit) 13.

The AC input means 11 is connected to a secondary circuit of the voltage transformer 4 and inputs the transformer voltage signal. This AC input means 11 is comprised of an insulation circuit and analog filter (anti-alias filter of analog-digital converter), although this internal configuration is not illustrated in FIG. 1.

The analog-digital conversion means 12 is comprised of a sampling hold circuit, multiplexer and analog-digital converter, although this internal configuration is not illustrated in FIG. 1 either, and receives the transformer voltage signal from the AC input means 11 as analog information, holds it with a predetermined sampling interval, then converts it into digital data 121, and outputs it.

For the analog-digital conversion means 12, a circuit configuration in which the sampling hold circuit and multiplexer are omitted may be used, or a circuit configuration using an analog-digital converter enclosing a sampling hold circuit may be used.

The MPU 13 implements a function as negative-feedback amplification means 14 in which a feedback circuit is constructed by a low pass filter and a function as integration means 15, by performing digital arithmetic operation for magnetic flux measurement based on the installed program. The negative-feedback amplification means 14 and integration means 15 are called the magnetic flux calculation means 16.

The input data of the negative-feedback amplification means 14 is the digital data 121 of the transformer voltage signal, and the output thereof is the DC offset removal signal 141. The input data of the integration means 15 is the DC offset removal signal 141, and the output thereof is the magnetic flux signal 151.

Instead of the MPU 13, the negative-feedback amplification means 14 and the integration means 15 may be installed in a programmable logical circuit, such as a PLD (Programmable Logical Device) or an FPGA (Field Programmable Gate Array). In Embodiment 1, an example using the transformer 2 as the stationary induction electrical apparatus was described, but needless to say, a similar system configuration is established even if a reactor, for example, is used.

(Function)

The functions of Embodiment 1 will now be described with reference to the magnetic flux calculation means 16 shown in FIG. 2.

The functions of the magnetic flux calculation means 16 are shown in the negative-feedback amplification means 14*d* and integration means 15*d*, which are equivalently represented by electronic circuits. In other words, 14*d* of FIG. 2 is an equivalent circuit of the negative-feedback amplification means 14, 15*d* is an equivalent circuit of the integration means 15, and according to Embodiment 1, [these means] are implemented by digital arithmetic operation using programs in which the respective functions are installed.

In the negative-feedback amplification means 14*d*, the amplification circuit (μ circuit) is comprised of an Op-Amp OP1, and the feedback circuit (β circuit) is comprised of an input resistor R1, Op-Amp OP2 and capacitor C1. In this case, the feedback circuit (β circuit) is a low pass filter of which time constant is high, and is equivalent to feeding back the DC component of the output quantity Y of the negative-feedback amplification means 14*d* as a feedback quantity F. Hence the negative-feedback amplification means 14*d* operates as a dynamic DC offset removal circuit for the input quantity X. Here the gain of the amplification circuit (μ circuit) of the negative-feedback amplification means 14*d*, that is the open loop gain, is G=1.

The integration means 15*d* is comprised of an input resistor R2, Op-Amp OP3, and capacitor C2, and outputs an integration quantity Z for the input quantity Y. The integration quantity Z corresponds to the magnetic flux signal 151.

The above equivalent circuits are expressed by the following digital arithmetic operation expressions.

$$F[n]=F[n-1]+Y[n-1]/D$$

$$Y[n]=X[n]-F[n]$$

$$Z[n]=Z[n-1]+Y[n]$$

where
X[n]: digital data 121 of transformer voltage
Y[n]: DC offset removal signal 141 (output of negative-feedback amplification means 14*d*)
Z[n]: magnetic flux signal 151 (output of integration means 15*d*)
F[n]: feedback quantity of negative-feedback amplification means 14*d*
n: sampling number of digital data 121 of transformer voltage
D: quantity corresponding to time constant of negative-feedback amplification means 14*d*

Here the time constant τ of the negative-feedback amplification means 14*d* is given by the following expression.

$$\tau = \Delta t \times D$$

where
Δt: sampling cycle of digital data

The quantity D corresponding to the time constant τ is determined to be an integral power of 2 ($2^n$, n: integer). If the quantity D corresponding to the time constant τ is an integral power of 2, the operation of the feedback quantity F by the MPU 13 can be implemented by the bit shift operation of an integral operation. Therefore the MPU 13 can perform arithmetic operation at very high-speed, and real-time processing can be easily implemented.

Considering the stability of the negative-feedback amplification means 14*d*, the time constant τ of the negative-feedback amplification means 14*d* must be 10 seconds or more. If such a time function is selected, the output quantity Y of the negative-feedback amplification means 14*d* could be in a state where the DC offset is not completely removed for 10 seconds to several minutes after operation start during the start and reset of MPU 13. If the integration means 15*d* performs the integral operation on the output quantity Y in this state, the integration result may diverge because the DC offset has not been removed.

Therefore at the timing immediately after the operation start, such as the start and reset of MPU 13, the program is controlled to allow the operation start of the integration means 15*d* to wait until the DC offset of the output quantity Y of the negative-feedback amplification means 14*d* is removed.

By the above-mentioned digital arithmetic operation for measuring magnetic flux, the magnetic flux signal 151 of the transformer can be determined from the digital data 121 of the transformer voltage. It is obvious that this digital arithmetic operation can be easily processed in real-time by the MPU 13.

It is also clear that when the magnetic flux signal 151 is determined using the above digital arithmetic operation for measuring magnetic flux, the digital data 121 to be the integration target need not be saved once in such a recording media as RAM (in the above description, the primary saving processing of general data to such a memory as RAM is not included in the MPU processing).

Needless to say, the digital arithmetic operation expressions of the negative-feedback amplification means 14*d* and integration means 15*d* may be implemented by expression other than the above-mentioned expression.

(Advantageous Effect)

As the above description shows, the magnetic flux measuring device according to Embodiment 1 has the following effect.

Normally when signals including the DC component are integrated, the integration result diverges in a short time, so integration for a long time is impossible. However according to Embodiment 1, the DC offset of the digital data 121 of the transformer voltage signal can be dynamically removed by the negative-feedback amplification means 14 in real-time. Therefore a stable integration operation can be performed continuously for a long time.

Also in Embodiment 1, in the digital data 121 of the transformer voltage for a predetermined period need not be saved once in a storage media to remove the DC offset of the digital data 121 of the transformer voltage. Therefore not only the measurement of a magnetic flux waveform for several tens of seconds is possible, but also the change of residual magnetic flux caused by transient voltage, which is generated after opening when an accident occurs of an external circuit of a transformer, such as a bus of an electric station, can be measured.

In other words, according to the magnetic flux measuring device of Embodiment 1, the magnetic flux can be accurately measured without being influenced by the DC offset component which superimposes on the measurement system, and the magnetic flux can be constantly and continuously measured without setting a limit in the magnetic flux measurement period.

Variant Form of Embodiment 1

In Embodiment 1, the negative-feedback amplification means 14 and integration means 15 are implemented by digital arithmetic operation, which is executed by the MPU 13 based on a program, but the negative-feedback amplification means 14 and integration means 15 may be implemented by analog circuits. To implement the negative-feedback amplification means 14 and integration means 15 by analog circuits, these circuits are normally inserted between the AC input means 11 and analog-digital conversion means 12 in FIG. 1. The circuit constant is selected to be a time constraint equivalent to Embodiment 1.

It is clear that a function and effect similar to Embodiment 1 can be acquired even if the negative-feedback amplification means 14 and integration means are implemented by analog circuits as described above.

Embodiment 2

A magnetic flux measuring device for a stationary induction electric equipment according to Embodiment 2 of the present invention will now be described with reference to FIG. 3.

(Configuration)

The system configuration of the magnetic flux measuring method according to Embodiment 2 is similar to that of Embodiment 1, so description on the drawings and configuration is omitted.

In Embodiment 2, however, the magnetic flux calculation means 16 described in Embodiment 1 is magnetic flux calculation means (system 1) 16-1 and magnetic flux calculation means (system 2) 16-2, and it is assumed that a program is installed on the MPU 13 so that the magnetic flux calculation processing can be executed in parallel using two sets of magnetic flux calculation means 16-1 and 16-2.

Needless to say, three or more sets of magnetic flux calculation means 16 may be installed on the MPU 13, so that three or more sets of magnetic flux calculation processings are executed in parallel.

(Function)

Figure 3:
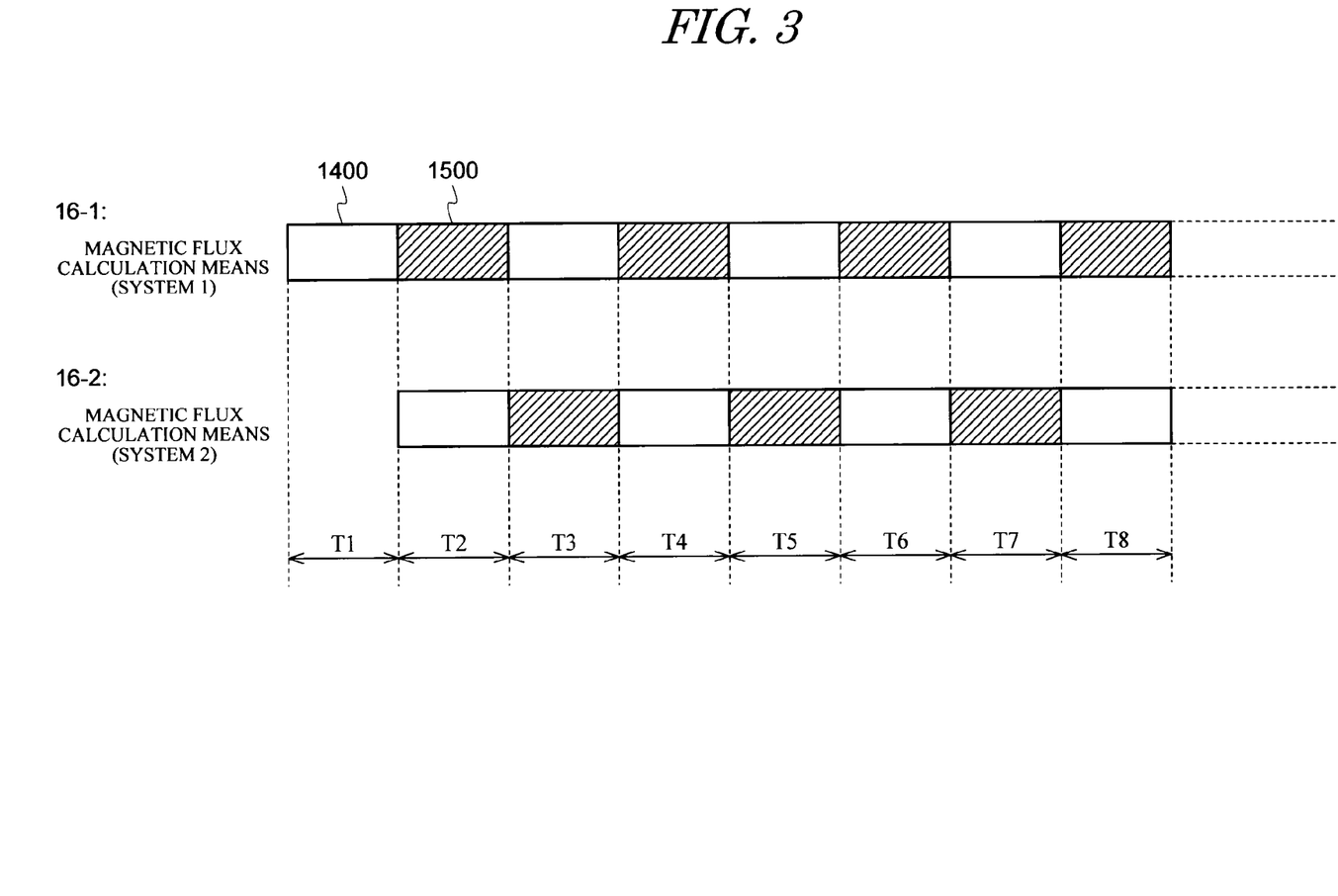
FIG. 3 is a diagram depicting an execution schedule of two sets of magnetic flux calculation means according to Embodiment 2 of the present invention.

FIG. 3 is a diagram depicting an execution schedule of two sets of magnetic flux calculation means (system 1) 16-1 and magnetic flux calculation means (system 2) 16-2 according to Embodiment 2 of the present invention in FIG. 3.

In FIG. 3, the execution period 1400 in the white portion is a period to execute only processing by the negative-feedback amplification means 14, and the execution period 1500 in the shaded portion is a period to execute processing both by the negative-feedback amplification means 14 and the integration means 15.

When the MPU 13 of the magnetic measuring device 10 is started up and execution of the magnetic flux calculation processing is started by the magnetic flux calculation means 16, [the magnetic flux calculation means 16-1 and 16-2] operate according to the following execution schedule.

(1) In period T1, the magnetic flux calculation means (system 1) 16-1 executes only processing by negative-feedback amplification means 14.

In other words, the magnetic flux calculation means (system 1) 16-1 executes the DC offset removal operation for the digital data 121 of the transformer voltage signal.

(2) In period T2, the magnetic flux calculation means (system 1) 16-1 executes processing by both the negative-feedback amplification means 14 and the integration means 15. The magnetic flux calculation means (system 2) 16-2 executes only processing by the negative-feedback amplification means 14.

In other words, the magnetic flux calculation means (system 1) 16-1 calculates the magnetic flux signal 151, and the magnetic flux calculation means (system 2) 16-2 executes the DC offset removal operation for the digital data 121 of the transformer voltage signal.

At the point of period T2, the magnetic flux calculation means (system 1) 16-1 has removed the DC offset.

(3) In period T3, the magnetic flux calculation means (system 1) 16-1 executes only processing by the negative-feedback amplification means 14. The magnetic flux calculation means (system 2) 16-2 executes processing by both the negative-feedback amplification means 14 and integration means 15.

In other words, the magnetic flux calculation means (system 1) 16-1 executes DC offset removal operation again for the digital data 121 of the transformer voltage, and the magnetic flux calculation means (system 2) 16-2 calculates the magnetic flux signal 151.

At the point of period T3, the magnetic flux calculation means (system 2) 16-2 has removed the DC offset.

(4) The above (2) and (3) are repeatedly executed in periods T4 and later, that is T4, T5, . . .

As described above, according to Embodiment 2, the magnetic flux signal 151 is calculated while alternately switching the magnetic flux calculation means (system 1) 16-1 and magnetic flux calculation means (system 2) 16-2. While one magnetic flux calculation means is outputting the magnetic flux signal 151, the other magnetic flux calculation means removes the DC offset of the digital data 121 of the transformer voltage signal, so the magnetic flux measuring device 10 as a whole can continuously output the magnetic flux signals 151 without interruption.

Here the switching times Tn (n=1, 2, 3, . . . ) of the magnetic flux calculation means 16 are selected so as to be an integral multiple of the frequency of the transformer voltage signal. The reason why switching time Tn is selected this way is because when the transformer voltage is in a stationary state, or when a transient change of the transformer voltage does not occur after power supply interruption of the transformer, the average value of the magnetic flux between the switching times Tn become zero.

Needless to say, the time required for removing DC offset of the digital data 121 of the transformer voltage signal, and the switching times Tn of the magnetic flux calculation means do not always match.

(Advantageous Effect)

The magnetic flux measuring device according to Embodiment 2 implements the following effect, in addition to the effect similar to Embodiment 1.

In the integral operation which continues for a long time, the problems of most concern are the divergence of the integral operation result and the runaway of the MPU as a result, but Embodiment 2 can decrease the risk of divergence of the integral operation result to even less than Embodiment 1.

In other words, the operation execution period of the integration means 15 is limited to a finite time after sufficiently removing the DC offset of the digital data 121 of the transformer voltage signal by the negative-feedback amplification means 14. Because of this, even if DC offset slightly remains and the integration result therefore indicates a tendency to diverge, the integral operation can be stopped before MPU 13 runaway. By switching and executing the two magnetic flux calculation means, continuity of the magnetic calculation operation can be maintained.

Embodiment 3

Figure 4:
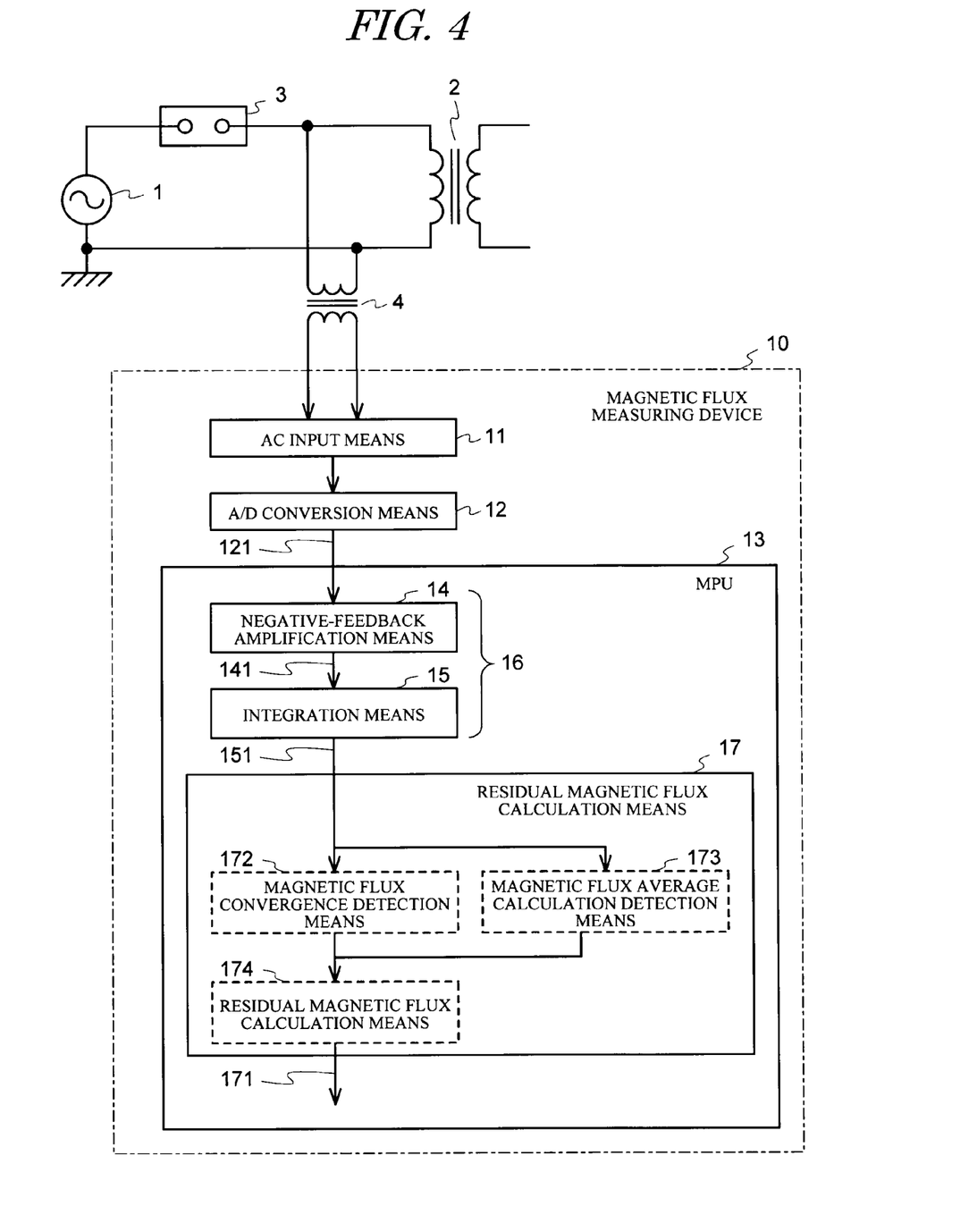
FIG. 4 is a diagram depicting a system configuration of a magnetic flux measuring device according to Embodiment 3 of the present invention.
Figure 5:
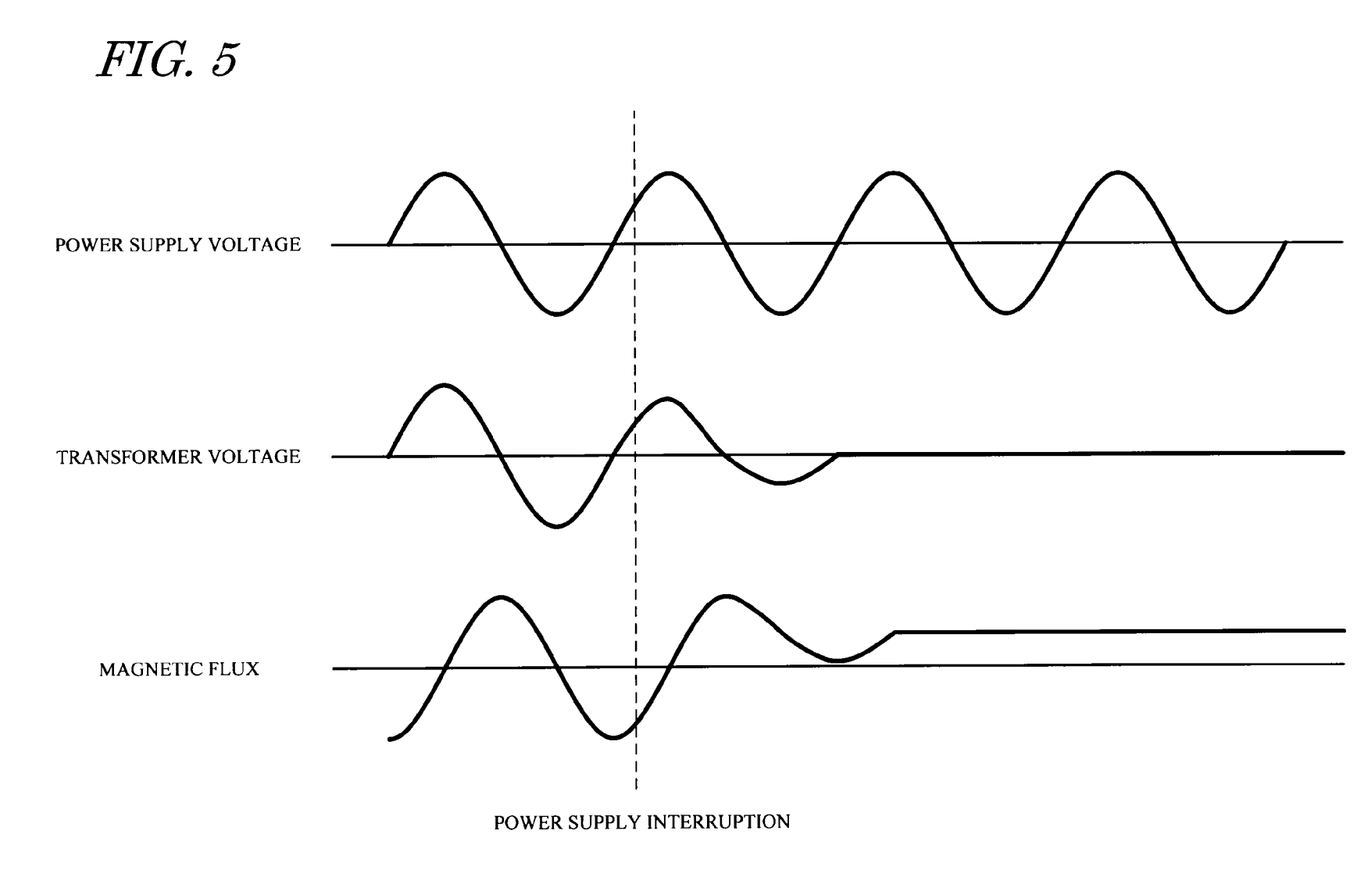
FIG. 5 is a waveform diagram of the transformer voltage and magnetic flux after power is interrupted (in the case of converging)
Figure 6:
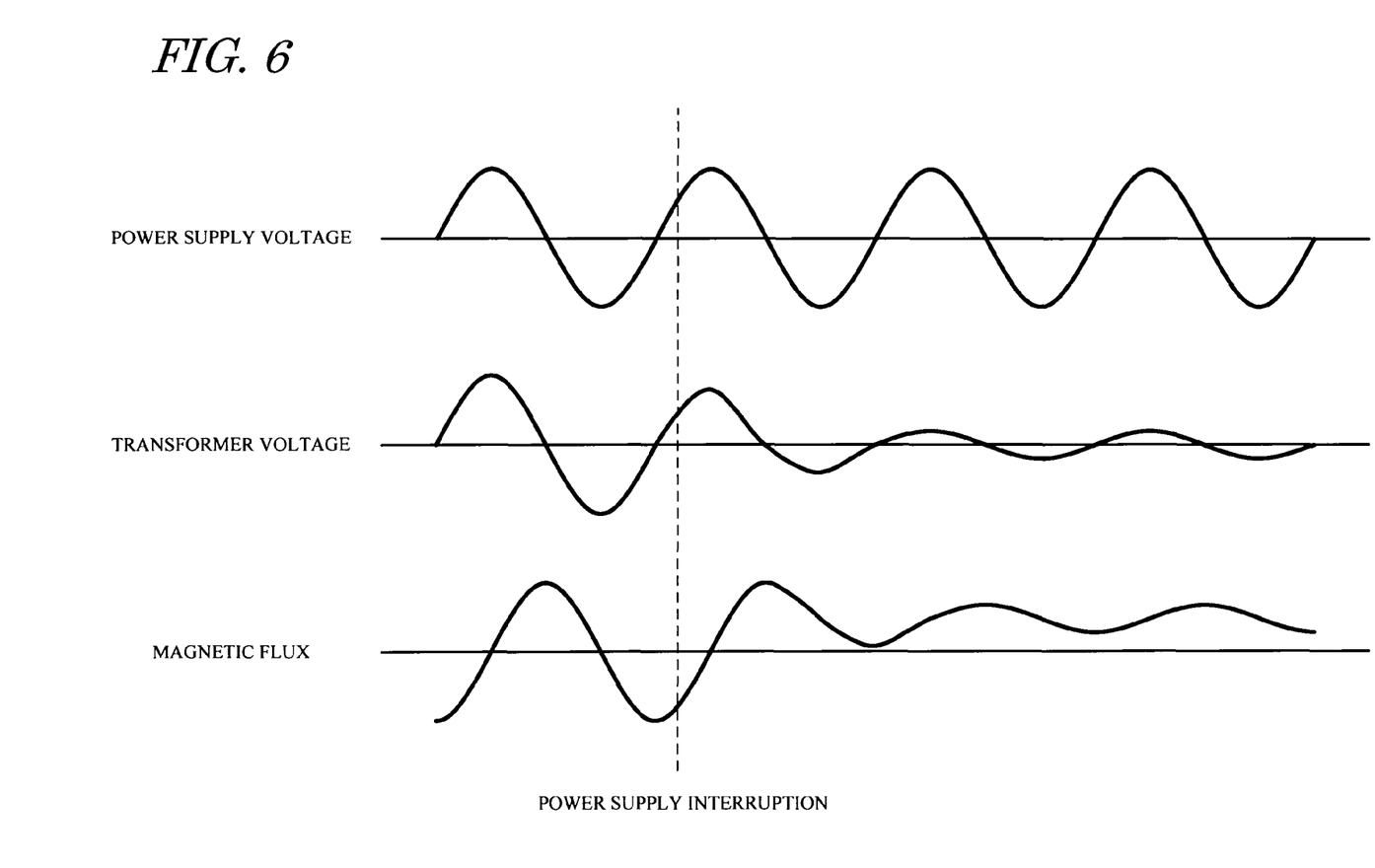
FIG. 6 is a waveform diagram of the transformer voltage and magnetic flux after power is interrupted (in the case of vibrating)

FIG. 4 is a diagram depicting a system configuration of a magnetic flux measuring device for a stationary indication electric apparatus according to Embodiment 3 of the present invention, and FIG. 5 and FIG. 6 are waveform diagrams depicting a transformer voltage and magnetic flux waveform after power is interrupted, where FIG. 5 is a waveform diagram when the magnetic flux waveform converges after power is interrupted, and FIG. 6 is a waveform diagram when the magnetic flux waveform vibrates after power is interrupted.

(Configuration)

The magnetic flux measuring device 10 of Embodiment 3 corresponds to the magnetic flux measuring device 10 of Embodiment 1 (FIG. 1), but a difference from the magnetic flux measuring device of Embodiment 1 is that residual magnetic flux calculation means 17, which is disposed to input a magnetic flux signal 151 after power supply interruption of the transformer to the MPU 13, calculates the residual magnetic flux 171.

This residual magnetic flux calculation means 17 is comprised of magnetic flux convergence detection means 172, magnetic flux average calculation means 173, and residual magnetic flux calculation means 174, and these means 172 to 174 are implemented by performing digital arithmetic operation based on a program installed on the MPU 13, just like the negative-feedback amplification means 14 and integration means 15.

The rest is the same as Embodiment 1 (FIG. 1), so description thereof is omitted.

(Function)

Out of the magnetic flux measurement processing according to Embodiment 3, the processing up to the measurement of magnetic flux signal 151 is the same as Embodiment 1 or Embodiment 2, so description thereof is omitted.

Calculation of residual magnetic flux 171 of the transformer is executed by the residual magnetic flux calculation means 17 of the MPU 13. There are two types of methods for calculating the residual magnetic flux 171, and the MPU 13 switches and uses the two types of methods.

(1) Processing Method by Magnetic Flux Convergence Detection Means 172

This processing method is used when the transformer voltage waveform and magnetic flux waveform after power is interrupted converge, as shown in FIG. 5.

The transformer voltage after the circuit breaker 3 is opened normally converges to a constant value after a predetermined time elapses. The magnetic flux at this converged point is measured as the residual magnetic flux value.

In other words, the magnetic flux convergence detection means 172 detects that the magnetic flux signal 151 after power supply interruption of the transformer converged to a constant value, or estimates that the magnetic flux signal 151 converged to a constant value. Here "detection" means that the convergence of the magnetic flux signal 151 to a constant value is directly measured, such as detecting that the change of the magnetic flux signal 151 stopped. "Estimation" means that a time for the magnetic flux signal 151 converges to a constant value is determined in advance, and convergence to a constant value is estimated by this time. Needless to say, either method can be used.

When it is detected that the magnetic flux signal 151 converged to a constant value, the residual magnetic flux calculation means 174 outputs the magnetic flux signal 151 at this timing as the residual magnetic flux 171. The residual magnetic flux 171 may be converted to such a physical unit as [Wb] before output or may be output as a standard value (unit is [P. U.]) with respect to the rated voltage. [The residual magnetic flux 171] may be output as a physical unit according to other applications. These conversion processings are executed by the residual magnetic flux calculation means 174.

(2) Processing Method by Magnetic Flux Average Calculation Means 173

This processing method is used when the transformer voltage waveform and magnetic flux waveform after power is interrupted vibrates, as shown in FIG. 6.

When the transformer 2 without load is switched by a circuit breaker 3 having an inter-pole capacitor (not illustrated), voltage with the system frequency appears continuously through the inter-pole capacitor continuously after circuit breaker 3 is opened. If magnetic flux is calculated by integrating this transformer voltage, the magnetic flux waveform becomes a vibration waveform as shown in FIG. 6. In order to remove this influence of the transformer voltage after circuit breaker 3 is opened, the residual magnetic flux is calculated by calculating the average value of the magnetic flux signal 151.

In other words, the magnetic flux average calculation means 173 calculates an average value of the magnetic flux signals 151 after power supply interruption of the transformer in a period which is an integral multiple of the cycle of the transformer voltage.

The residual magnetic flux calculation means 174 outputs the average value of the magnetic flux signal 151 calculated by the magnetic flux average calculation means 173 as the residual magnetic flux 171. Other processing by the residual magnetic flux calculation means 174 is the same as method (1).

Normally it depends on the system to which the transformer is connected and the impedance of the transformer whether the processing method by the magnetic flux convergence detection means 172 or the processing method by the magnetic flux average calculation means 173 is selected. When these [parameters] are determined, only one method may be installed on the MPU 13, since only one method is used normally. One method may be selected by stabilization.

(Advantageous Effect)

The magnetic flux measuring device according to Embodiment 3 can implement the following effects in addition to the effects similar to Embodiment 1 and Embodiment 2.

In a conventional magnetic flux measuring device, there are various cases when accurate measurement of residual magnetic flux of the transformer are difficult. By applying the magnetic flux measuring device of Embodiment 3, residual magnetic flux can be measured at high precision under conditions in which residual magnetic flux measurement is conventionally difficult.

Embodiment 4

Figure 7:
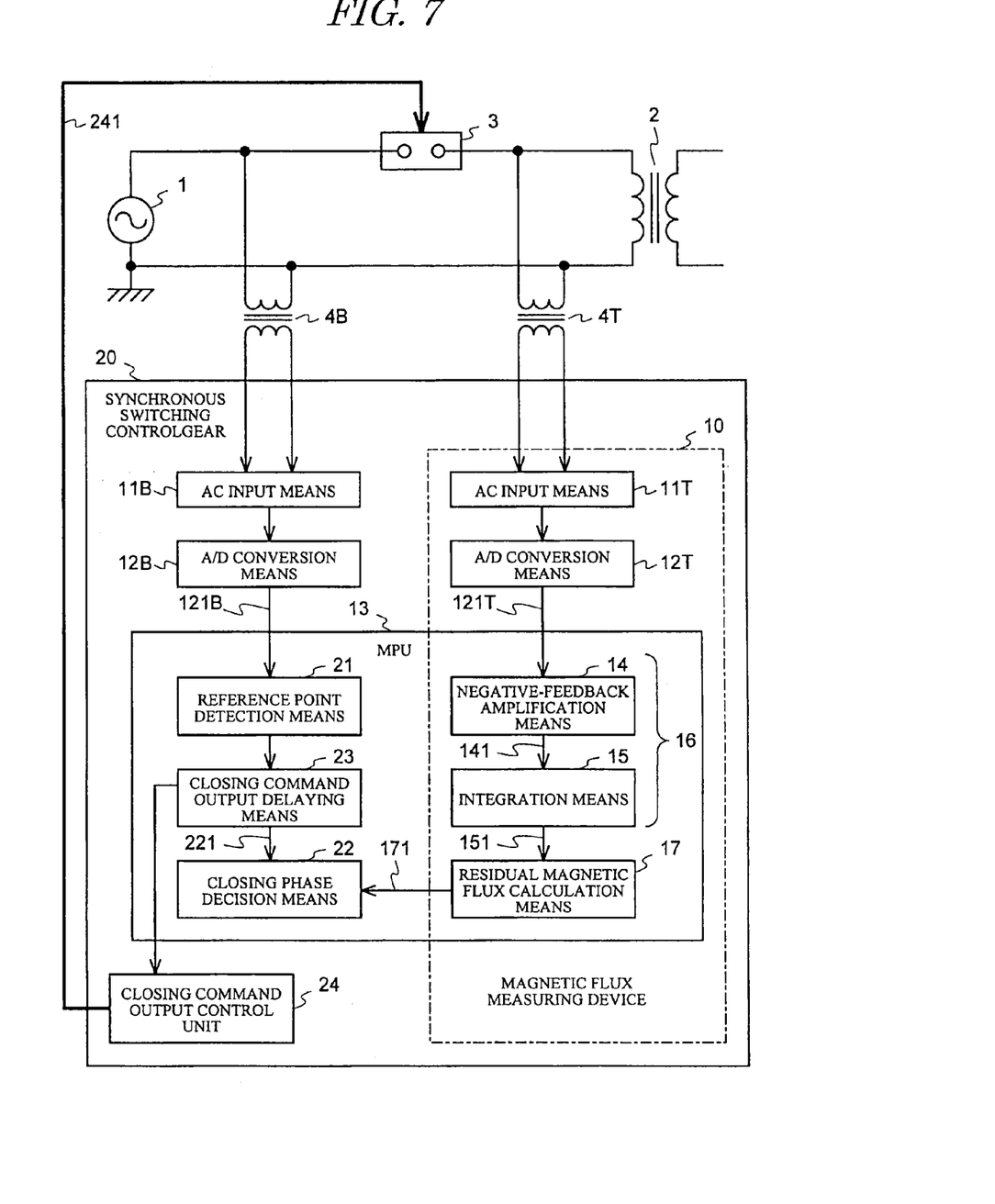
FIG. 7 is a diagram depicting a system configuration of a synchronous switching controlgear for circuit breaker according to Embodiment 4 of the present invention.
Figure 8:
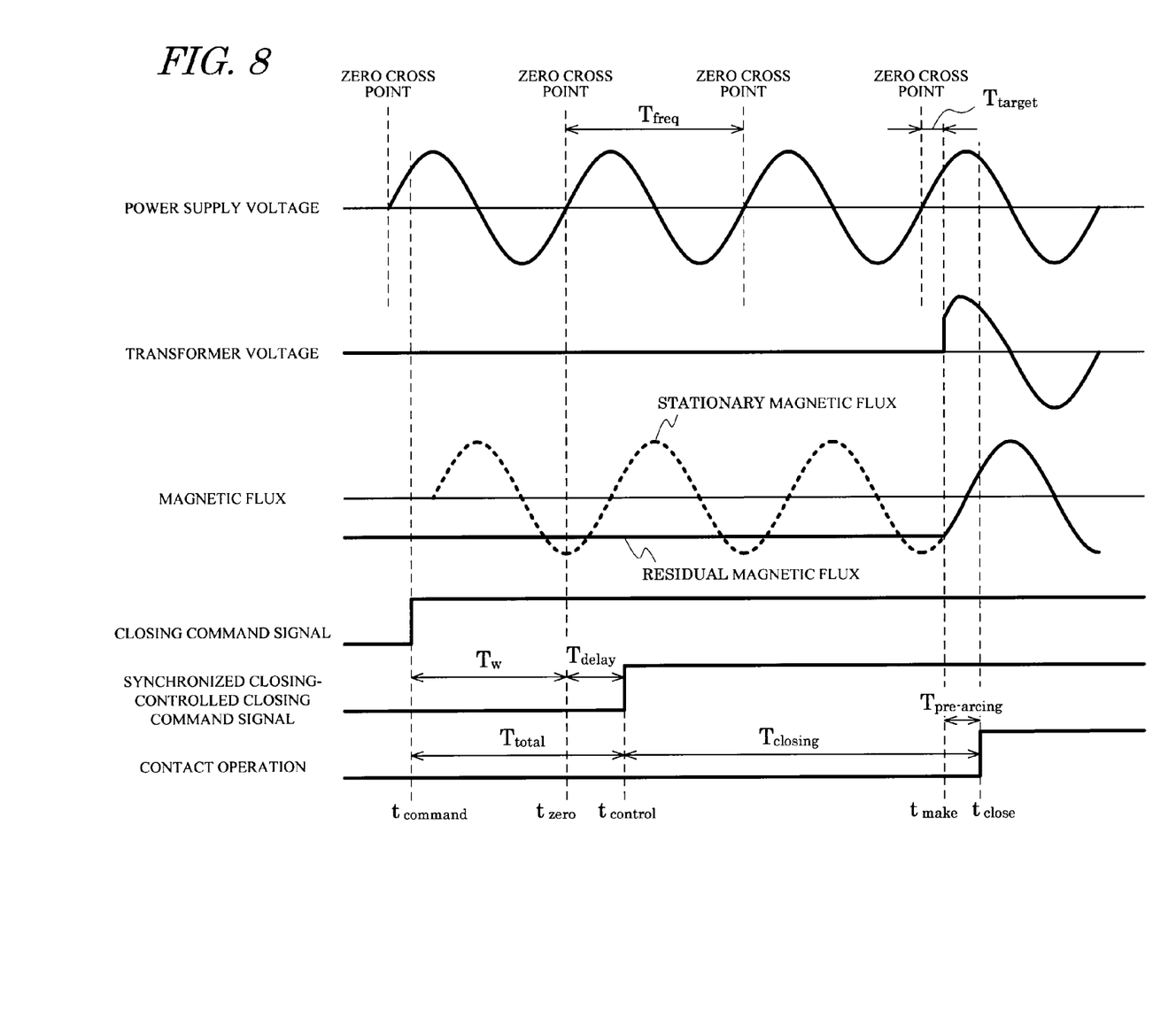
FIG. 8 is a timing chart of the synchronous switching controlgear for circuit breaker according to Embodiment 4 of the present invention.

FIG. 7 is a diagram depicting a system configuration of a synchronous switching controlgear for circuit breaker according to Embodiment 4 of the present invention, and FIG. 8 is a timing chart of the synchronous switching controlgear.

(Configuration)

In FIG. 7, the portion enclosed by the solid line is a synchronous switching controlgear 20, in which the magnetic flux measuring device 10, described in Embodiment 1 (FIG. 1) to Embodiment 3 (FIG. 4) is enclosed as a part of composing elements.

4T is a voltage transformer corresponding to the voltage transformer 4 in FIG. 1, for measuring transformer voltage which is applied to a primary side of a transformer 2. 4B is a voltage transformer newly installed in the present embodiment, so as to measure the bus voltage or power system voltage (hereafter power supply voltage) of the sub-station.

The hardware of the synchronous switching controlgear 20 is comprised of an AC input means for transformer voltage 11T, analog-digital conversion means 12T, AC input means for power supply voltage 11B, analog-digital conversion means 12B, MPU (MicroProcessor Unit) 13, and feed instruction output control unit 24.

The composing elements of the magnetic flux measuring device 10 disposed in Embodiment 4 are AC input means for transformer voltage 11T, analog-digital conversion means 12T, and a plurality of means for magnetic flux measurement 14 to 17 implemented by the digital arithmetic operation for magnetic flux measurement by the MPU 13. The AC input means 11T corresponds to the AC input means 11 of Embodiment 1, and the analog-digital conversion means 12T corresponds to the analog-digital conversion means 12 of Embodiment 1.

The magnetic flux measuring device 10 of Embodiment 4 corresponds to the magnetic flux measuring device 10 of Embodiment 3 (FIG. 4). Since the configuration thereof is the same as Embodiment 3 (FIG. 4), description thereof is omitted.

The AC input means 11B is connected to the secondary side of the voltage transformer 4B for measuring the power supply voltage so as to input the power supply voltage signal. This AC input means 11B is comprised of an insulation circuit and analog filter (anti-alias filter of analog-digital converter) and other composing elements, just like the AC input means 11T.

The analog-digital conversion means 12B is comprised of a sampling hold circuit, multiplexer, analog-digital converter and other composing elements, just like the analog-digital conversion means 12T, and receives the power supply voltage signal and transformer voltage signal as analog information, holds them with a predetermined sampling interval, then converts the analog information into the digital data 121B, and outputs the result.

For the analog-digital conversion means 12B, a circuit configuration without the sampling hold circuit and multiplexer, just like the analog-digital conversion means 12T, may be used, or a configuration enclosing the sampling hold circuit may be used. The AC input means for power supply voltage 11B and AC input means for transformer voltage 11T may be integrated, or the analog-digital conversion means for power supply voltage 12B and analog-digital conversion means for transformer voltage 12T may be integrated.

The MPU 13 implements the functions of a plurality of means for magnetic flux measurement 14 to 17 and a plurality of means for synchronous switching controls to 23 by performing digital arithmetic operation based on an installed program. Needless to say, the functions of each means for magnetic flux measurement 14 to 17 and functions of each means for synchronous switching control 21 to 23 may be implemented by different MPUs.

The configuration of magnetic flux measurement, which is implemented by digital arithmetic operation for magnetic flux measurement of the MPU 13, is as mentioned above, and is therefore omitted, and the configuration of synchronous switching control, which is implemented by the digital arithmetic operation for synchronous switching control, will be described.

The MPU 13 implements a function as reference point detection means 21 for detecting a reference point (normally zero cross point) for synchronous switching control from the digital data on power supply voltage 121B by performing digital arithmetic operation for synchronous switching control based on an installed program, a function as closing phase decision means 22 for determining a target feed phase 221 from the residual magnetic flux 171, and a function as a closing command output delaying means 23 for calculating the delay time for the closing command from a host system (e.g. control device), and performing delay control of the closing command.

The closing command output control unit 24 is a circuit to output the closing command signal 241, which performs synchronous closing control for the circuit breaker 3 according to the control of the closing command output delay means 23, and is comprised of a semiconductor switch, such as an FET.

The configuration of the synchronous switching controlgear 20 in FIG. 7 is a configuration of a general synchronous switching controlgear, and needless to say, a configuration other than FIG. 7 may be used.

The synchronous switching controlgear 20 in FIG. 7 shows only the composing elements of synchronous closing control, but may include composing elements of synchronous opening control, which are not illustrated in FIG. 7.

(Function)

The magnetic flux measurement processing by the MPU 13 will be described first.

Out of the magnetic flux measurement processing in Embodiment 4, the processing up to the measurement of residual magnetic flux 171 of the transformer is the same as Embodiment 3, therefore description thereof is omitted.

The closing phase decision means 22 of the MPU 13 decides the target feed phase (electric connection phase) 221 of circuit breaker 3 considering the residual magnetic flux 171 of the transformer. In other words, as mentioned later in FIG. 8, a phase, in which the estimated stationary magnetic flux when the circuit breaker feeds (magnetic flux waveform indicated by the broken line in FIG. 8) and the residual magnetic flux substantially match, is calculated as the target feed phase 221.

The synchronous closing control operation will now be described with reference to the timing chart of the synchronous switching controlgear in FIG. 8.

In the synchronous closing control, after the closing command signal is received at the timing of $t_{command}$, [the system] waits for the timing $t_{zero}$ of the zero cross point of the power supply voltage which comes next. Based on the timing $t_{zero}$ of this zero cross point, the closing command signal 241 after synchronous closing control is performed, is output when the delay time of the synchronous closing delay time $T_{delay}$ is elapsed, and the feed coil of the circuit breaker 3 is driven.

Ideally, the synchronous closing delay time $T_{delay}$ is given by the following expression, where $T_{target}$ is the time from the zero cross point to the target feed phase 221, $T_{pre-arcing}$ is pre-arcing time corresponding to the target feed phase 221 and the closing operation time $T_{closing}$ of the circuit breaker.

$$T_{delay} = T_{freq}(T_{target} + T_{pre-arcing} - (T_{closing} \% T_{freq}))$$
$$(0 \leq T_{delay} < 2 \times T_{freq})$$

where ($T_{closing} \% T_{freq}$) is a remainder of $T_{closing}/T_{freq}$.

The closing command output delay means 23 controls the ON operation of the semiconductor switch of the ON command output control unit 24 using the target feed phase 221 determined by the closing phase decision means 22 of the MPU 13 and the zero cross point of the power supply voltage detected by the reference point detection means 21. When the semiconductor switch of the closing command output control unit 24 turns ON, the closing command signal 241 after synchronous closing control is output to the feed coil of the circuit breaker 3. As a result, the circuit breaker 3 is turned ON at a timing when the magnetizing inrush current of the transformer 2 is substantially at zero.

The function of the synchronous switching controlgear 20 described in Embodiment 4 is a function of a general synchronous switching controlgear, and needless to say, functions other than Embodiment 4 may be used.

The function of the synchronous switching controlgear 20 described in Embodiment 4 is only a function of synchronous closing control, but needless to say, the function of synchronous opening control may be included.

(Advantageous Effect)

When the synchronous switching controlgear for circuit breaker according to Embodiment 4 controls to suppress the magnetizing inrush current of the transformer by synchronous feed control of the stationary induction electrical apparatus (transformer), accuracy to measure the residual magnetic flux of the transformer greatly influences the effect of magnetizing inrush current suppression, and in the case of a conventional magnetic flux measuring device, there are various cases in which accurate measurement of residual magnetic flux of a transformer is difficult.

Whereas according to the synchronous switching controlgear for circuit breaker of Embodiment 4, the synchronous switching controlgear 20 can measure the residual magnetic flux at high precision, even under conventionally difficult residual magnetic flux measurement conditions. For example, even in a case when the residual magnetic flux of the transformer changes due to transient voltage, which is generated after opening when an accident occurs in an external circuit of a transformer, such as a bus of an electric station, as pointed out in Non-patent document 1, the residual magnetic flux can be accurately measured if Embodiment 4 is used.

Therefore according to Embodiment 4, magnetizing inrush current when feeding the transformer, for example, can be effectively suppressed.

The invention claimed is:

1. A magnetic flux measuring method for a stationary induction electrical apparatus, which measures a magnetic flux of the stationary induction electrical apparatus using a voltage waveform of the stationary induction electrical apparatus, the magnetic flux of the stationary induction electrical apparatus being determined by the steps of:
   inputting a voltage waveform of the stationary induction electrical apparatus into a negative-feedback amplification means which contains a feedback circuit that is constructed by a low pass filter;
   integrating output of the negative-feedback amplification means by integration means;
   wherein a plurality of sets of magnetic flux calculation means constituted by the negative-feedback amplification means and the integration means are provided, and
   determining magnetic flux by switching the plurality of sets of magnetic flux calculation means at a switching time which is an integral multiple of a frequency of power supply voltage.

2. The magnetic flux measuring method for stationary induction electrical apparatus according to claim 1, wherein the magnetic flux of the stationary induction electrical apparatus is determined by integrating the output of the negative-feedback amplification means using the integration means when a DC offset of the output of the negative-feedback amplification means is in substantially a zero state.

3. The magnetic flux measuring method for stationary induction electrical apparatus according to claim 1, wherein residual magnetic flux is determined by calculating an average value of a period which is an integral multiple of a cycle of power supply voltage, for the magnetic flux measured after power of the stationary induction electrical apparatus is interrupted.

4. The magnetic flux measuring method for stationary induction electrical apparatus according to claim 1, wherein when the magnetic flux, which is measured after the power of the stationary induction electrical apparatus is interrupted, converges into substantially a constant value, this magnetic flux is regarded as residual magnetic flux.

5. A synchronous switching controlgear which performs synchronous switching control for a circuit breaker connected to an electric power system circuit, along with a stationary induction electrical apparatus by measuring a magnetic flux of a stationary induction electrical apparatus using voltage waveform of the stationary induction electrical apparatus and residual magnetic flux for the magnetic flux measured after power of the stationary induction electrical apparatus is interrupted, comprising:
   input means for inputting a voltage waveform of the stationary induction electrical apparatus;
   negative-feedback amplification means for inputting a voltage signal which is output from the input means, and which contains a negative feedback circuit that is constructed by a low pass filter;
   integration means for integrating output of the negative-feedback amplification means to determine a magnetic flux;
   residual magnetic flux calculation means for determining residual magnetic flux by calculating an average value of a period which is an integral multiple of a cycle of power supply voltage, for the magnetic flux determined by the integration means;
   closing phase decision means for deciding a target feed phase according to the residual magnetic flux determined by the magnetic flux measuring device;
   reference point detection means for detecting a reference point for synchronous switching control based on the voltage waveform of the power supply of the electric power system circuit; and
   closing command output delaying means for calculating delay time for a closing command, and performing delay control of the closing command based on the target feed phase decided by the closing phase decision means and the reference point detected by the reference point detection means.

6. A synchronous switching controlgear which performs synchronous switching control for a circuit breaker connected to an electric power system circuit, along with a stationary induction electrical apparatus by measuring a magnetic flux of a stationary induction electrical apparatus using voltage waveform of the stationary induction electrical apparatus and residual magnetic flux for the magnetic flux measured after power of the stationary induction electrical apparatus is interrupted, comprising:
   input means for inputting a voltage waveform of the stationary induction electrical apparatus;
   negative-feedback amplification means for inputting a voltage signal which is output from the input means, and which contains a negative feedback circuit that is constructed by a low pass filter;
   integration means for integrating output of the negative-feedback amplification means to determine a magnetic flux;
   residual magnetic flux calculation means for determining residual magnetic flux by detecting or estimating that the magnetic flux determined by the integration means has converged into a constant value;
   closing phase decision means for deciding a target feed phase according to the residual magnetic flux determined by the magnetic flux measuring device;

reference point detection means for detecting a reference point for synchronous switching control based on the voltage waveform of the power supply of the electric power system circuit; and closing command output delaying means for calculating delay time for a closing command, and performing delay control of the closing command based on the target feed phase decided by the closing phase decision means and the reference point detected by the reference point detection means.

7. A synchronous switching controlling method which performs synchronous switching control for a circuit breaker connected to an electric power system circuit, along with a stationary induction electrical apparatus by measuring a magnetic flux of a stationary induction electrical apparatus using a voltage waveform of the stationary induction electrical apparatus and residual magnetic flux for the magnetic flux measured after power of the stationary induction electrical apparatus is interrupted, said method comprising:

inputting a voltage waveform of the stationary induction electrical apparatus into a negative-feedback amplification means which contains a feedback circuit that is constructed by a low pass filter;

integrating output of the negative-feedback amplification means by integration means;

determining a residual magnetic flux by calculating an average value of a period which is an integral multiple of a cycle of power supply voltage, for the magnetic flux measured after power of the stationary induction electrical apparatus is interrupted;

deciding a target feed phase according to the residual magnetic flux determined by the magnetic flux measuring device;

detecting a reference point for synchronous switching control based on the voltage waveform of the power supply of the electric power system circuit; and calculating delay time for a closing command, and performing delay control of the closing command based on the target feed phase decided by the closing phase decision means and the reference point detected by the reference point detection means.

8. A synchronous switching controlling method which performs synchronous switching control for a circuit breaker connected to an electric power system circuit, along with a stationary induction electrical apparatus by measuring a magnetic flux of a stationary induction electrical apparatus using a voltage waveform of the stationary induction electrical apparatus and residual magnetic flux for the magnetic flux measured after power of the stationary induction electrical apparatus is interrupted, said method comprising:

inputting a voltage waveform of the stationary induction electrical apparatus into a negative-feedback amplification means which contains a feedback circuit that is constructed by a low pass filter;

integrating output of the negative-feedback amplification means by integration means;

measuring the magnetic flux after the power of the stationary induction electrical apparatus is interrupted, converges into substantially a constant value, this magnetic flux is regarded as residual magnetic flux;

deciding a target feed phase according to the residual magnetic flux determined by the magnetic flux measuring device;

detecting a reference point for synchronous switching control based on the voltage waveform of the power supply of the electric power system circuit; and calculating delay time for a closing command, and performing delay control of the closing command based on the target feed phase decided by the closing phase decision means and the reference point detected by the reference point detection means.

* * * * *